(12) United States Patent
Stecklein

(10) Patent No.: US 6,252,433 B1
(45) Date of Patent: Jun. 26, 2001

(54) SINGLE EVENT UPSET IMMUNE COMPARATOR

(75) Inventor: Toby James Stecklein, San Antonio, TX (US)

(73) Assignee: Southwest Research Institute, San Antonio, TX (US)

( * ) Notice: Subject to any disclaimer, the term of this patent is extended or adjusted under 35 U.S.C. 154(b) by 0 days.

(21) Appl. No.: 09/310,248

(22) Filed: May 12, 1999

(51) Int. Cl.⁷ .................................................. H03K 5/22
(52) U.S. Cl. .............................. 327/65; 327/70; 327/74; 327/77
(58) Field of Search .................. 327/63, 64, 65, 327/68, 69, 70, 71, 72, 74, 77

(56) References Cited

U.S. PATENT DOCUMENTS

| | | | |
|---|---|---|---|
| 3,599,096 | * 8/1971 | Stemples et al. | 327/74 |
| 3,624,538 | 11/1971 | Gere et al. | 330/84 |
| 3,925,633 | 12/1975 | Partridge | 219/10.49 |
| 4,101,789 | * 7/1978 | Ruhnau | 327/72 |
| 4,105,900 | 8/1978 | Martin | 327/526 |
| 4,149,160 | * 4/1979 | Bozarth et al. | 327/74 |
| 4,375,099 | * 2/1983 | Waters et al. | 327/72 |
| 4,408,164 | 10/1983 | East | 328/117 |
| 4,585,001 | 4/1986 | Belt | 128/419 |
| 4,613,770 | * 9/1986 | Raab | 327/74 |
| 4,613,777 | * 9/1986 | Kibe | 327/262 |
| 4,661,880 | 4/1987 | Futsuhara | 316/93 |
| 4,672,544 | 6/1987 | Chizallet et al. | 364/414 |
| 4,694,200 | 9/1987 | Hetyei | 307/358 |
| 4,785,200 | 11/1988 | Huntington | 327/203 |
| 4,786,865 | 11/1988 | Arimura | 324/158 |
| 4,797,804 | 1/1989 | Rockett, Jr. | 365/154 |
| 4,805,148 | 2/1989 | Diehl-Nagle et al. | 365/154 |
| 4,809,226 | 2/1989 | Ochoa, Jr. | 365/156 |
| 4,863,878 | 9/1989 | Hite et al. | 437/26 |
| 4,866,498 | 9/1989 | Myers | 357/30 |
| 4,866,718 | 9/1989 | Fosdick | 317/40.1 |
| 4,912,420 | * 3/1990 | Parnell | 327/78 |
| 4,912,675 | 3/1990 | Blake et al. | 365/154 |
| 4,914,629 | 4/1990 | Blake et al. | 365/154 |
| 4,931,990 | 6/1990 | Perkin | 365/1 |
| 4,956,814 | 9/1990 | Houston | 365/154 |
| 5,031,180 | 7/1991 | McIver et al. | 371/36 |
| 5,039,876 | 8/1991 | Hochwald et al. | 327/225 |
| 5,046,044 | 9/1991 | Houston et al. | 365/156 |
| 5,053,848 | 10/1991 | Houston et al. | 357/51 |
| 5,111,429 | 5/1992 | Whitaker | 365/156 |
| 5,175,605 | 12/1992 | Pavlu et al. | 257/369 |
| 5,196,734 | 3/1993 | Han | 327/199 |
| 5,204,990 | 4/1993 | Blake et al. | 257/904 |
| 5,307,142 | 4/1994 | Corbett et al. | 365/156 |
| 5,311,070 | 5/1994 | Dooley | 327/208 |
| 5,315,544 | 5/1994 | Yokote et al. | 365/154 |
| 5,341,009 | 8/1994 | Young et al. | 257/296 |
| 5,406,513 | 4/1995 | Canaris et al. | 365/181 |
| 5,418,473 | 5/1995 | Canaris | 326/27 |
| 5,446,404 | * 8/1995 | Badyal et al. | 327/63 |
| 5,504,703 | 4/1996 | Bansal | 365/156 |
| 5,525,923 | 6/1996 | Bialas, Jr. et al. | 327/210 |
| 5,548,227 | 8/1996 | Minami | 326/33 |
| 5,657,267 | 8/1997 | Levi | 365/149 |
| 5,949,280 | * 9/1999 | Sasaki | 327/74 |

* cited by examiner

Primary Examiner—Timothy P. Callahan
Assistant Examiner—An T. Luu
(74) Attorney, Agent, or Firm—Baker Botts L.L.P.

(57) ABSTRACT

A single event upset immune analog comparator which comprises simple comparators with either open-collector, or non-open-collector outputs. Input voltage and/or current compensation may also be provided by duplicating external reference circuitry for presentation to the comparator reference inputs. Various embodiments of the single event upset immune analog comparator may also comprise single event upset immune AND gates, OR gates, or invertors, as determined by particular design requirements.

16 Claims, 6 Drawing Sheets

SINGLE EVENT UPSET IMMUNE COMPARATOR

BACKGROUND OF THE INVENTION

1. Technical Field

This invention relates generally to analog signal comparators, and more particularly, to an apparatus and method for combining existing analog comparators to produce a single event upset immune comparator for use in the outer space environment.

2. History of Related Art

Analog voltage comparators are used in almost every area of electronic circuitry, such as power supplies, data transmission and reception, and data acquisition. Typically, the comparator provides a logic-level signal at its output, depending on the relative voltage values present at each one of two inputs. The output voltage level is thus determined by which one of the inputs has a higher voltage level. For example, if the comparator has an input labeled "plus," and an input labeled "minus," then the output will go to a low logic-level if the minus input voltage value is higher than the voltage value present at the plus input. However, if the plus input voltage value is higher than that present at the minus input, the output will be driven to a high logic-level.

A Single Event Upset (SEU) typically refers to the interrupted function of a digital electronic circuit, usually occurring at the single-bit level, when a particle of ionizing radiation impacts upon the circuit and changes the logic-value of its output. The exact effect of any SEU depends on the particular device involved, and its relation to other components in a particular circuit. The generalized effect for a logic-dependent circuit is the changing of an output value from its normally expected level to the opposite (e.g., "1" to "0" or "0" to "1"). Such changes, induced by ionizing radiation, generally result in unexpected and undesirable circuit performance.

Due to the shielding effects of the earth environment, SEUs due to ionizing radiation are not normally considered as part of electronic circuit design. However, in the outer space environment, where electronic components may perform functions of a more critical nature (e.g., failure may result in the loss of life or a very expensive spacecraft), the SEU becomes part of many electronic design decisions.

SEU immune circuitry has been developed for various digital logic families. However, such circuitry (e.g. silicon-on-sapphire) may be prohibitively expensive or very difficult to procure in a timely fashion due to limited production runs. Other logic families, such as Complementary Metal Oxide Semiconductor (CMOS) logic, are SEU immune, but may not have the desired current-drive ability. Further, many digital logic SEU immune approaches have been advanced, but analog components which are SEU immune have not received the same attention by manufacturers.

Therefore, what is needed is a design approach to provide SEU immune comparators for use in the outer space environment which is relatively independent of the logic family employed, and does not require a prohibitively expensive technology for manufacture. Further, since conventional comparators are beset by the problem of offset voltage and currents at the inputs, it would be desirable to provide a SEU immune comparator design which accommodates such offset voltage and currents to produce a reliable comparator output even when the input voltages are fairly close to each other in value.

Further, since individual comparators are typically manufactured as dual, quad, or larger groupings of identical units in a single package, it would be desirable to provide a SEU immune comparator which takes advantage of multiple unit packaging and minimizes the use of non-identical components for enhanced reliability. In addition, since the power used and volume occupied by electronic circuitry is to be minimized in the outer space environment, it is desirable to provide a SEU comparator deign which makes use of the least possible number of electronic components so as to provide an attractive alternative to other methods which result in greater power consumption or larger amounts of circuit real estate consumed.

SUMMARY OF THE INVENTION

For the purposes of the present invention, the term "SEU immune" refers to a circuit which renders the probability of malfunction due to SEUs relatively low compared to conventional devices. In other words, while a SEU immune circuit will normally continue to function as expected by the designer during a single SEU event, it is within the realm of probability (although highly unlikely) for the SEU immune circuit to malfunction due to multiple, simultaneous SEU events.

The apparatus of the present invention can be embodied in several different configurations, dependent on the particular type of logic family used to implement the SEU-immune function, and whether the circuitry is designed to compensate for offset voltages and currents at comparator inputs.

For example, one implementation of a SEU immune comparator may comprise a pair of commonly-available open-collector output analog comparators, each having a plus input and a minus input. The first and second plus inputs are adapted to receive the output from an external circuit designed to provide a reference voltage for the plus inputs, and the minus inputs are adapted to receive the output from an external circuit designed to provide a reference voltage for the minus inputs. The open-collector outputs of the two comparators are connected together so as to provide a normally-low logic output. If it is desired to provide a normally-high logic output, then a SEU immune inverter is connected to the normally-low output and the reference voltage connections are reversed (i.e., the plus input reference voltage is now applied to the minus comparator inputs, and the minus input reference voltage is now applied to the plus comparator inputs).

If a non-open-collector logic family is used to design the SEU immune comparator, then a slightly different approach must be used. In this case, for a normally-low output, the comparator outputs are supplied to the input of a SEU immune AND gate. For a normally-high output, the comparator outputs are also not connected directly together, but are supplied to individual inputs of an SEU immune OR gate. However, in this case, the external circuitry reference voltages are not exchanged (i.e., the external circuitry reference voltage for the plus input remains connected to the comparator plus inputs, and the external circuitry reference voltage for the minus input remains connected to the minus comparator inputs).

When the circuit design requires compensation for voltage and/or current offsets which are present at the comparator inputs, a slightly different topology must be used. The difference in approach for this case lies in the use of duplicated external reference voltage circuitry which allows adjustment of the voltage level at the input of each comparator. That is, instead of using a single reference circuit to supply the plus inputs of each separate comparator, one plus external circuit typically drives one plus input of a single comparator. A second, duplicate, plus reference external circuit is used to drive the second plus input of the second comparator. Further, the external circuitry for the minus input is also duplicated. That is, the minus input for the first comparator is typically driven by a first minus reference external circuit, and the minus input for the second comparator is typically driven by a duplicate, minus reference external circuit. Each of the duplicate plus and minus reference circuits has the capability for voltage adjustment so as to enable matching the comparison trip points for the converter pair. With the exception of the duplicated circuitry, all of the circuit topologies described above remain the same, given the requirements for normally-low or normally-high output, and the use of open-collector, or non-open-collector logic families.

BRIEF DESCRIPTION OF THE DRAWINGS

A more complete understanding of the structure and operation of the present invention may be had by reference to the following detailed description when taken in conjunction with the accompanying drawings, wherein.

DETAILED DESCRIPTION OF PRESENTLY PREFERRED EXEMPLARY EMBODIMENTS

For the present invention, several terms must be defined so that the following description may be properly understood. One such term, "SEU immune" has been defined previously.

A comparator may have various circuit configurations used to drive the output. Some comparators make use of a simple "open-collector" as their output. This means the last stage of the internal design of the comparator contains a transistor, the output pin available to the designer comprising the transistor collector with nothing else internally connected. This "open-collector" output pin is typically connected to an external pull-up resistor, which is in turn connected to the positive voltage supply pin for the comparator. Other comparators, referred to as "non-open-collector," do not require a pull-up resistor at the output to insure proper logic transitions from low to high levels. In either case, these two types of comparators will be so-designated by the words "open-collector" or "non-open-collector," and pull-up resistors will not be shown, even though they may be required for the circuit design, as such pull-up resistors are well known in the art.

Comparators may also be described as "normally high" or "normally low." This designation refers to the state of the comparator input reference voltages; "normally high" refers to the plus input voltage being normally higher in value than the minus input voltage, while "normally low" means just the opposite. When the term "normally-high" and "normally-low" are used in the following description, the reference will be to the overall comparative function of the inventive embodiment, with respect to the voltage supplied to the inputs, and not to the individual comparator or combination of comparators, or their output logic levels. It will be assumed throughout the following description that all simple comparators share the same positive and negative power supply voltages.

Figure 1:
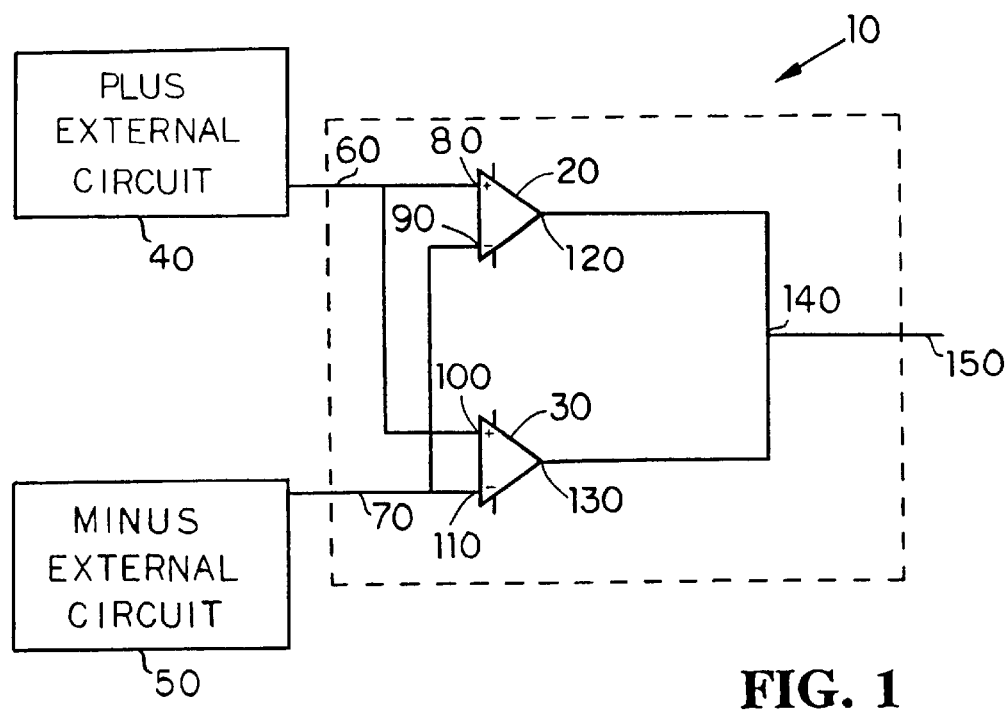
FIG. 1 is a schematic block diagram of the present invention for the case of open-collector comparators producing a normally-low logic output and having no input-offset compensation.

Turning now to FIG. 1, a schematic block diagram of the present invention can be seen. A pair of simple, commonly-available comparators having open-collector outputs, comprise the heart of the inventive embodiment. The SEU immune comparator, with a normally-low, open-collector (NL-OC) output 10 can be seen. The comparator 10, comprises a first simple comparator 20, may be similar to, or identical to, a National Semiconductor LM139, and has a first open-collector (OC) comparator output 120, a first OC plus input 80, and a first OC minus input 90.

The second simple comparator 30 may be similar to, or identical to, the first simple comparator 20. The second simple comparator 30 has a second OC comparator output 130, a second OC plus input 100, and a second OC minus input 110. It should be noted that the designation "OC" at the comparator inputs 80, 90, 100, and 110, does not signify that an open-collector transistor is present at the inputs; rather, the designation merely refers to inputs for a comparator having an open-collector output.

In this configuration, the circuit has been designated normally-low which means that the minus input reference circuitry voltage is normally of a higher value than the plus input reference circuitry voltage. That is, the first minus external circuit 50, first minus output 70 voltage value is normally higher than the first plus output 60 voltage value supplied by the first plus external circuit 40. If it is assumed that the voltage and current offsets present at the inputs of the comparators (80, 90, 100, and 110) are not a design consideration, possibly because the differential input at each of the comparators is relatively great, or because the cross-over speed transition times at the inputs are relatively rapid, then input offset compensation is not required. In this case, the first plus output 60 may be connected directly to the first OC plus input 80 and the second OC plus input 100 of the first and second simple comparators 20 and 30, respectively. Similarly, the first minus output 70 may be connected directly to the first and second OC minus inputs 90 and 110, respectively.

When the comparator outputs 120 and 130, which are normally-low (NL), are connected together at the OC output connection 140 so as to provide a final NL output 150, a SEU immune comparator, NL-OC 10 is realized. That is, a SEU event which directly affects the output of either the first simple comparator 20 or the second simple comparator 30, will not affect the value of the final NL output 150. Referring to the definition of "SEU immune," described above, it can also be noted that a SEU event which simultaneously affects the output of the first and second OC comparator outputs 120 and 130 will indeed adversely affect the final NL output 150 value. However, for the purposes of this invention, the probability of such an occurrence is extremely low.

As mentioned previously, it is typically the case that a pull-up resistor (not shown) will be connected between the OC output connection 140 and the positive power supply for the comparators to provide appropriate logic level voltages at the final NL output 150. Such use of a pull-up resistor is well known in the art and is not claimed as part of the invention.

Figure 2:
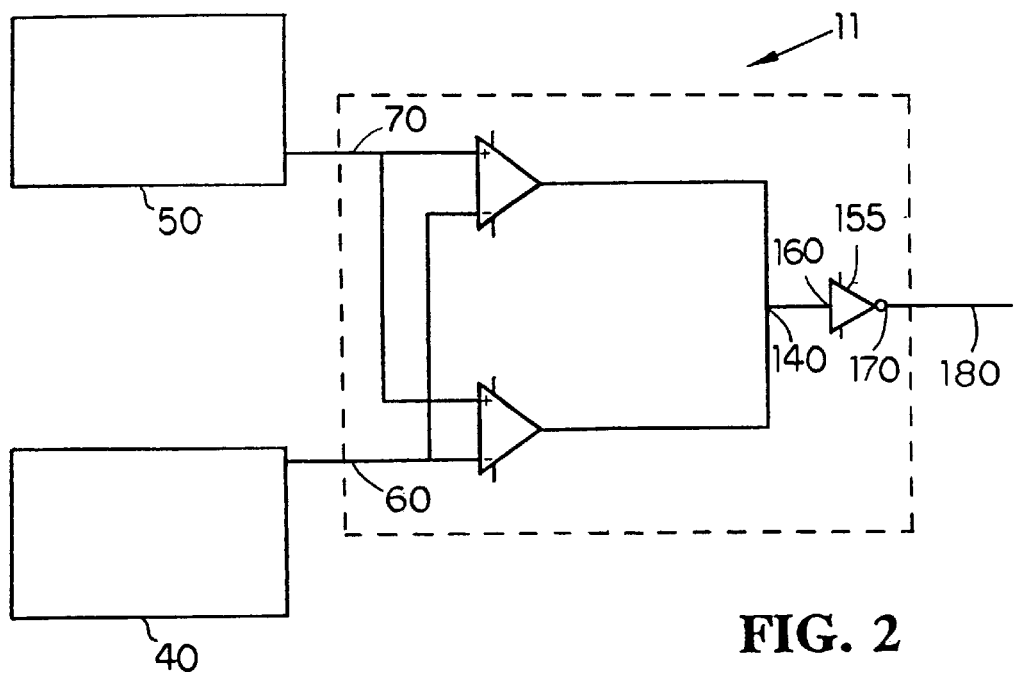
FIG. 2 is a schematic block diagram of the present invention for the case of open-collector comparators producing a normally-high logic output and having no input-offset compensation.

Turning now to FIG. 2, a SEU immune comparator, having a normally-high, open-collector (NH-OC) 11 can be seen. In this case, since the reference voltage supplied by the first plus external circuit 40 is normally higher than the reference voltage supplied by the first minus external circuit 50, and it is desired to provide a SEU immune NL output at the OC output connection 140, the reference voltage connections must be reversed with respect to the description given for the circuit in FIG. 1. That is, the first minus external circuit 50, first minus output 70 is connected directly to the first and second OC plus inputs 80 and 100, respectively, instead of the first and second OC minus inputs, 90 and 110. Similarly, the first plus output 60 of the first plus external circuit 40 is connected directly to the first and second OC minus inputs 90 and 110, respectively, instead of the first and second OC plus inputs 80 and 100. The resulting NL output at the OC output connection 140 is connected to a SEU immune inverter 155 at the inverter input 160. The logic-level output at the inverter output 170 will now be NH, as provided at the final NH output 180. The SEU immune inverter 155 may be similar to, or identical to, a Harris Semiconductor CD4069.

As shown in the illustration of FIG. 2, the inverter 155 is a digital-logic inverter gate. The gate may be fabricated from CMOS technology which is a readily-available SEU immune logic family. As long as the supply voltages for the inverter 155 are compatible with the voltages presented by the outputs 120 and 130 of the comparators 20 and 30, any suitable SEU immune logic family may be used. Of course, individual circuit elements, such as resistors, diodes, or transistors may also be used in place of the inverter 155, as long as these elements are SEU immune.

Figure 3:
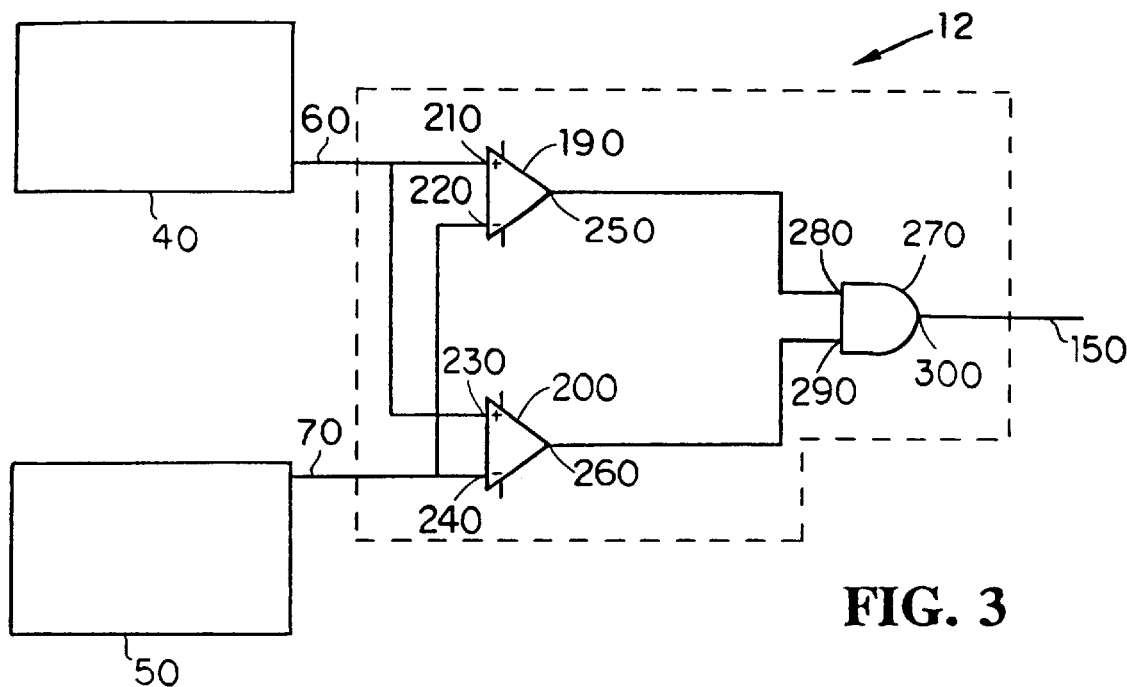
FIG. 3 is a schematic block diagram of the present invention for the case of non-open-collector comparators producing a normally-low logic output and having no input-offset compensation.

At times, it is undesirable to utilize comparators having OC outputs, or, it is undesirable to connect the outputs 120 and 130 of the simple comparators 20 and 30 together. FIG. 3 illustrates an inventive embodiment which provides a SEU immune comparator having a NL non-open-collector (NL-NOC) 12 output. In this case, the comparator 12 comprises a pair of simple comparators, namely, a first simple comparator with NOC output 190, and a second simple comparator with NOC output 200. The first and second simple comparators 190 and 200 may be similar to, or identical to, a Texas Instruments TLC3702. The first simple comparator 190 has a first NOC comparator output 250, a first NOC plus input 210, and a first NOC minus input 220. Similarly, the second simple comparator 200 has a second NOC comparator output 260, a second NOC plus input 230, and a second NOC minus input 240. As noted above, the designation "NOC" refers to the output circuitry for the individual comparators 190 and 200, and not to the circuitry at the inputs (210, 220, 230, and 240) of the comparators 190 and 200.

In this case, and similarly to the implementation illustrated in FIG. 1, the first plus output 60 of the first plus external circuit 40 is connected directly to the first and second NOC plus inputs 210 and 230. Likewise, the first minus output 70 of the first minus external circuit 50 is connected directly to the first and second NOC minus inputs 220 and 240.

Since the outputs 250 and 260 of the comparators 190 and 200 are not connected together in this embodiment, a SEU immune AND gate 270 is used to provide the desired result. The SEU immune AND gate 270, which may comprise a CMOS AND gate (similar to, or identical to, a Harris Semiconductor CD408), some other logic family which is SEU immune, or some combination of individual components (i.e., diodes resistors, transistors, etc.) which are SEU immune, has an AND output 300, a first AND input 280, and a second AND input 290. Supply voltages for the AND gate 270 must be compatible with the voltages supplied at the comparator outputs 250 and 260. In this implementation, the first NOC comparator output 250 is connected directly to the first AND input 280, and the second NOC comparator output 260 is connected directly to the second AND input 290.

A SEU event which affects the first or second NOC comparator output 250 or 260, respectively, will not affect the resulting AND output 300 as it is provided to the final NL output 150. However, as was noted previously, it is theoretically possible for one or more SEU events to simultaneously affect the outputs 250 and 260 of the comparators 190 and 200 so as to produce an anomalous result at the final NL output 150.

Figure 4:
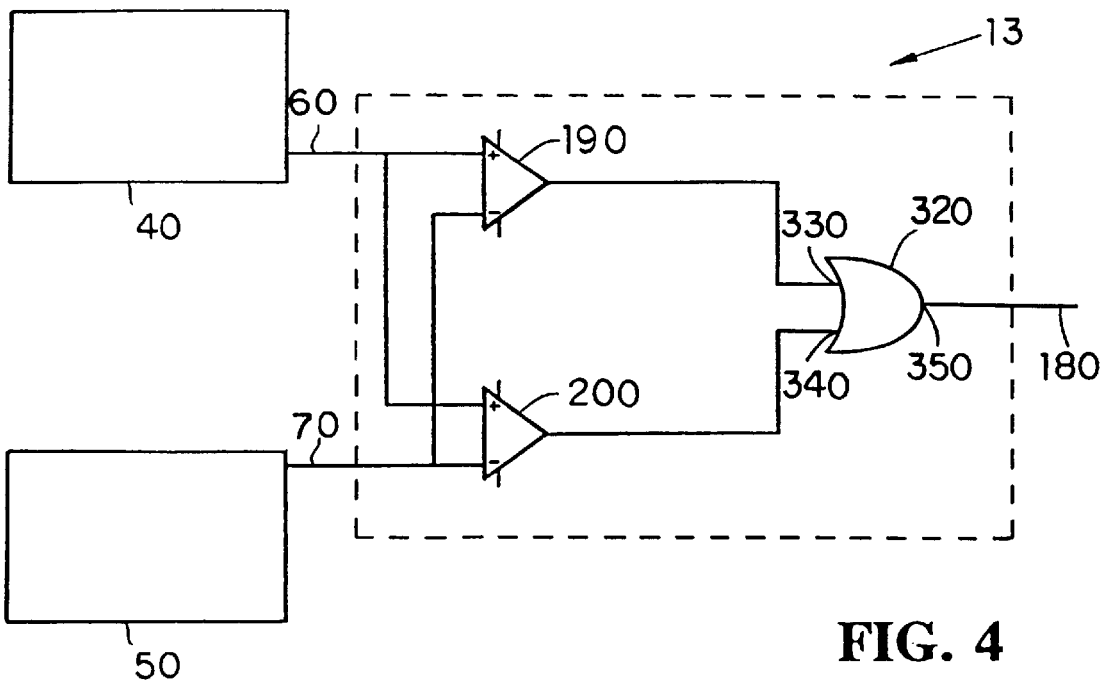
FIG. 4 is a schematic block diagram of the present invention for the case of non-open-collector comparators producing a normally-high logic output and having no input-offset compensation.

If the paired-comparator outputs are not connected together, and it is desired to provide a SEU immune comparator having a NH output, then the circuit configuration found in FIG. 4 can be used. Several differences can be noted between the circuit illustrated in FIG. 4 and that of FIG. 2. The first is the connections between the external circuitry reference voltages and the comparators 190 and 200. In this case, the expected NH output means that the first plus output 60 of the first plus external circuit 40 will normally be of a higher value than the first minus output 70 of the first minus external circuit 50. Thus, the first and second NOC comparator outputs 250 and 260 will normally indicate a logic-high level. The second difference is seen in the use of a SEU immune OR gate 320, which has an OR output 350, a first OR input 330, and a second OR input 340. The OR gate 320 may be similar to, or identical to, a Harris Semiconductor CD4071. As noted previously, the OR gate 320 may comprise a CMOS OR gate, an OR gate from another SEU immune logic family, or a combination of individual SEU immune circuit elements, such as resistors, diodes, transistors, etc. Since the logic signal levels present at the first and second OR inputs 330 and 340 are NH, then the OR output 350 will also normally be provided as a NH value, which is provided as a final NH output 180. A single SEU event which provides an anomalous output from the first or second simple NOC comparator 190 or 200 will therefore not affect the ultimate logic level present at the final NH output 180. Because of the presence of the SEU immune OR gate 320, the reference voltage connections do not have to be reversed in this inventive embodiment.

One characteristic of simple comparators is the presence of offset voltages and/or currents at the reference inputs. These offsets form a voltage differential between the plus and minus inputs of any particular comparator, which in an ideal configuration, would simply not be present. For example, in an ideal comparator implementation, connecting the plus and minus inputs directly together would result in an unknown logic level output because the reference voltage provided to each input is the same. That is, neither the plus input or the minus input receives a voltage value which is higher than the other. Practically, due to the presence of offset voltages and/or currents, one comparator input will in fact be higher than the other, and the output will provide either a high or low level, depending on which is greater. Such offsets are usually on the order of millivolts or microamps. As mentioned previously, offsets are not normally a design consideration if the voltage differential (as supplied by external circuitry) is relatively large. Further, if the transition or crossover time period between references is relatively fast, the effects of offsets can be minimized. However, there are also many circumstances where the presence of such offsets becomes a significant design consideration. The following inventive embodiments are offered for use in such situations.

Figure 5:
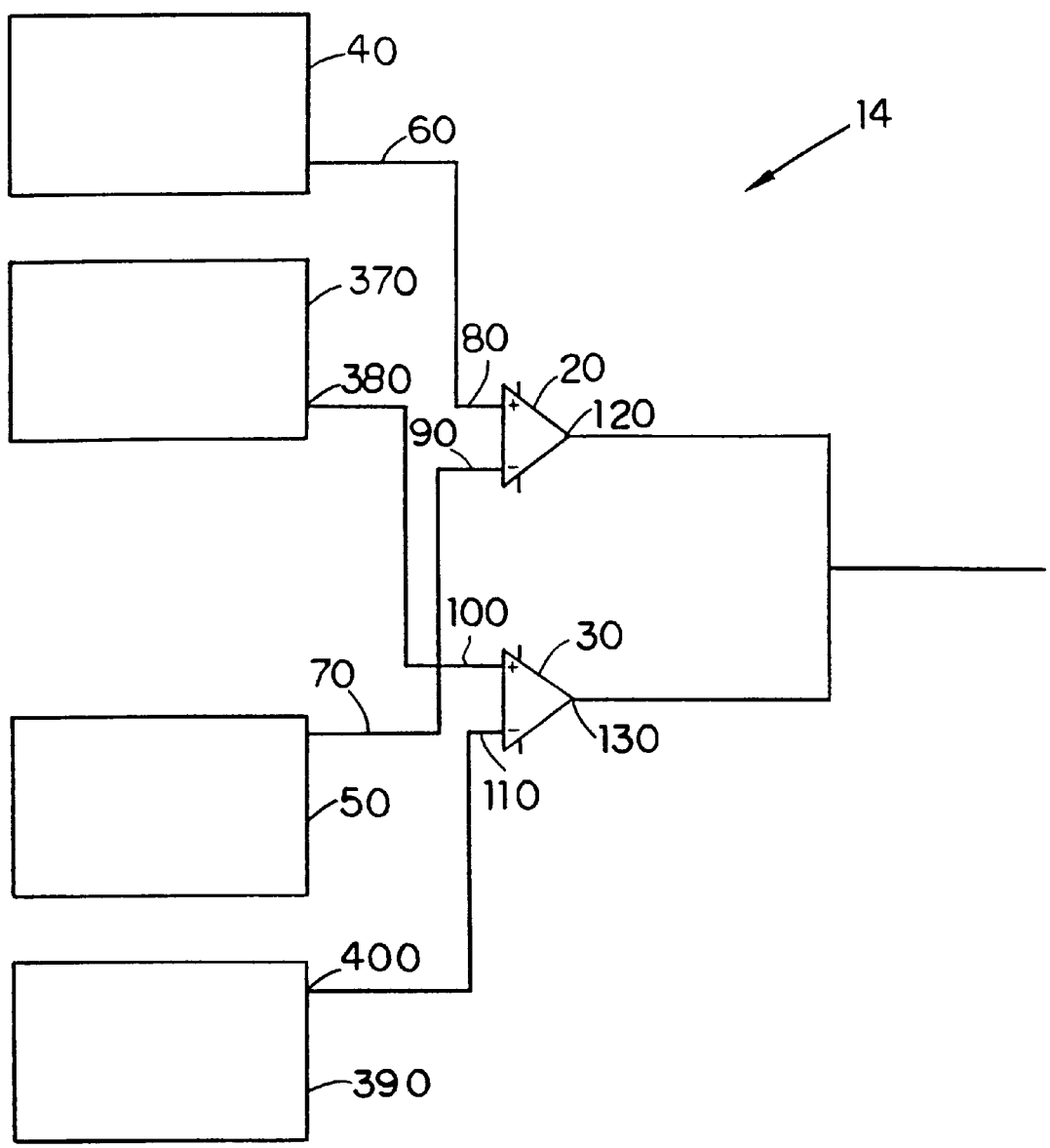
FIG. 5 is a schematic block diagram of the present invention for the case of open-collector comparators providing a normally-low logic output and input-offset compensation.

FIGS. 5, 6, 7, and 8 illustrate various embodiments of the present invention which provide an SEU immune comparator having input-offset compensation. Turning now to FIG. 5, an SEU immune comparator with offset compensation (WOC) and having an NL-OC output 14 can be seen. In comparing the circuitry of FIG. 5 with that of FIG. 1, it can be noted that the primary difference lies in the use of duplicate circuitry for input reference voltages. More particularly, as much of the first plus external circuit 40 is duplicated by the second plus external circuit 370 as is needed to set each of the comparators 20 and 30 to trip at the same voltage levels. Similarly, the second minus external circuit 390 is constructed so as to duplicate the circuitry of the first minus external circuit 50 (as much as is necessary) to provide matched functionality between the comparators 20 and 30.

When trip levels of the comparators are in the millivolt range, voltage and current offsets can lead to erroneous comparator activity. To compensate for this, Select At Test (SAT) components, usually variable resistors, are included in the external circuitry, either the plus or minus circuitry, or both. These component values are then adjusted to make the comparators trip at the desired level, with offsets and all component initial tolerances included. The same is done for all the external circuitry where SATs are used. Thus, it can be seen that two identical external circuits may have different SAT final values due to the difference in offsets, and initial tolerances of components, between comparators. SAT components will not, however, compensate for changes after the SAT values are fixed. For example, temperature, radiation, and life-time effects combine to alter circuit performance over time. However, offsets due to operation over time are usually small compared to the SAT-compensated offsets.

As can be seen in FIG. 5, the first plus output 60 of the first plus external circuit 40 is connected directly to the first OC plus input 80, and the first minus output 70 of the first minus external circuit 50 is connected directly to the first OC minus input 90, as is shown in FIG. 1. However, in this case, the second plus output 380 of the second plus external circuit 370 is connected directly to the second OC plus input 100 of the second simple comparator 30. Similarly, the second minus output 400 of the second minus external circuit 390 is connected directly to the second OC minus input 110 of the second simple comparator 30. Assuming that the activity of the second plus external circuit tracks the activity of the first plus external circuit 40, and the activity of the second minus external circuit 390 tracks the activity of the first minus external circuit 50, the outputs 120 and 130 of the comparators 20 and 30 will be unaffected by any offset voltages and/or currents which may have been created by the previously-illustrated direct connections of FIG. 1. All of the other connections and functions of the circuits remain the same.

Figure 6:
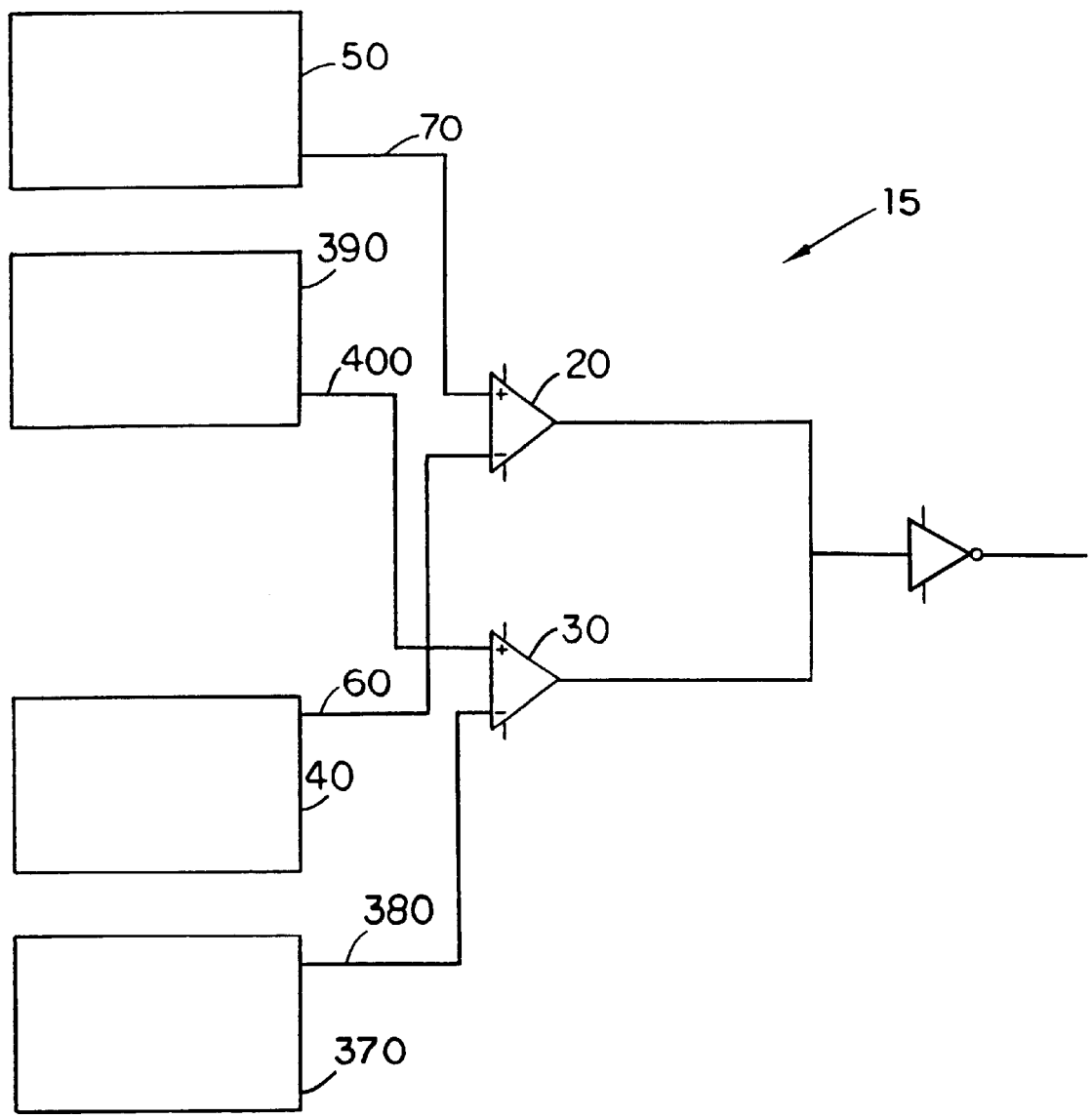
FIG. 6 is a schematic block diagram of the present invention for the case of open-collector comparators providing a normally-high logic output and having input-offset compensation.
Figure 7:
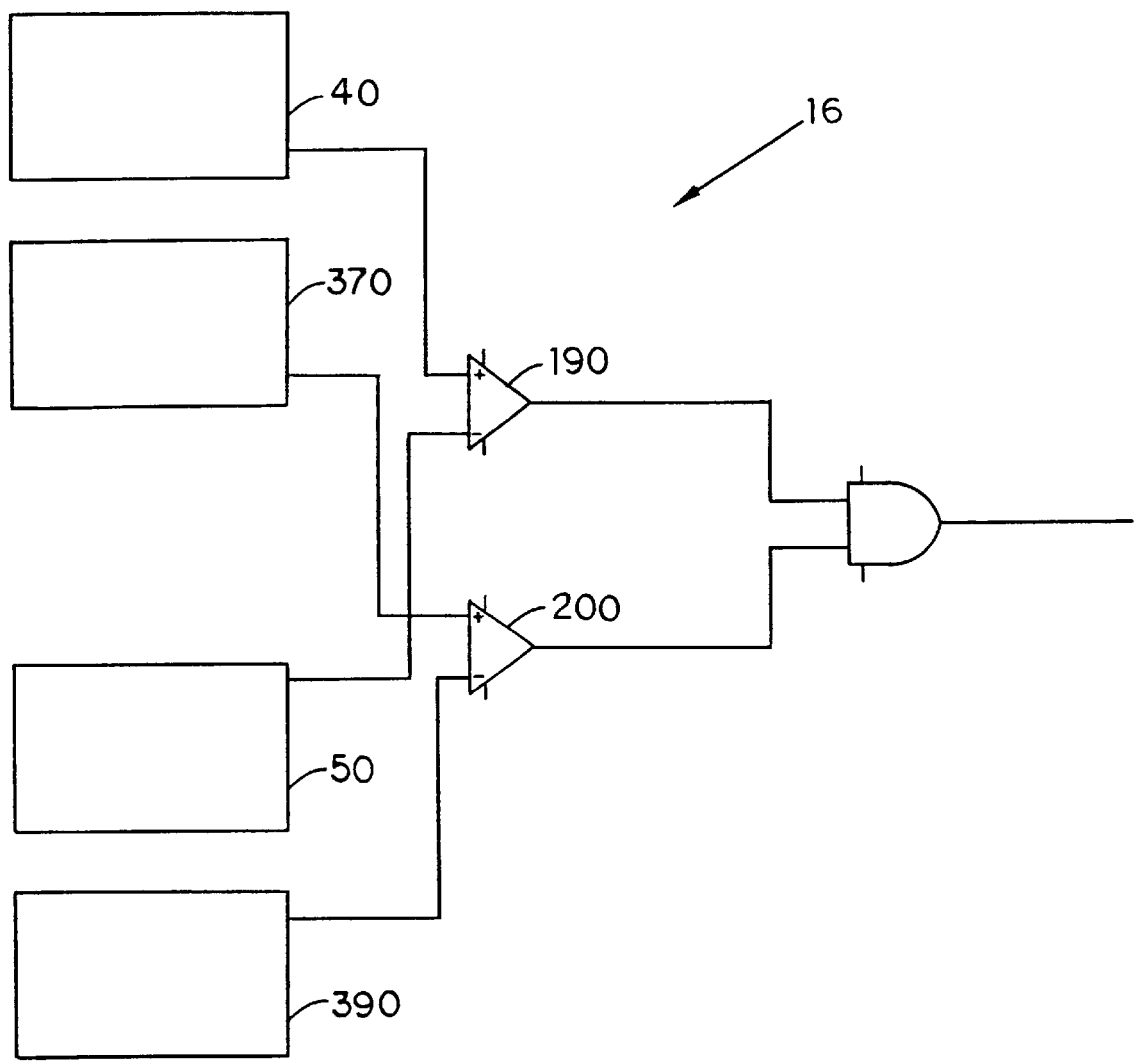
FIG. 7 is a schematic block diagram of the present invention for the case of non-open-collector comparators providing a normally-low logic output and having input-offset compensation.
Figure 8:
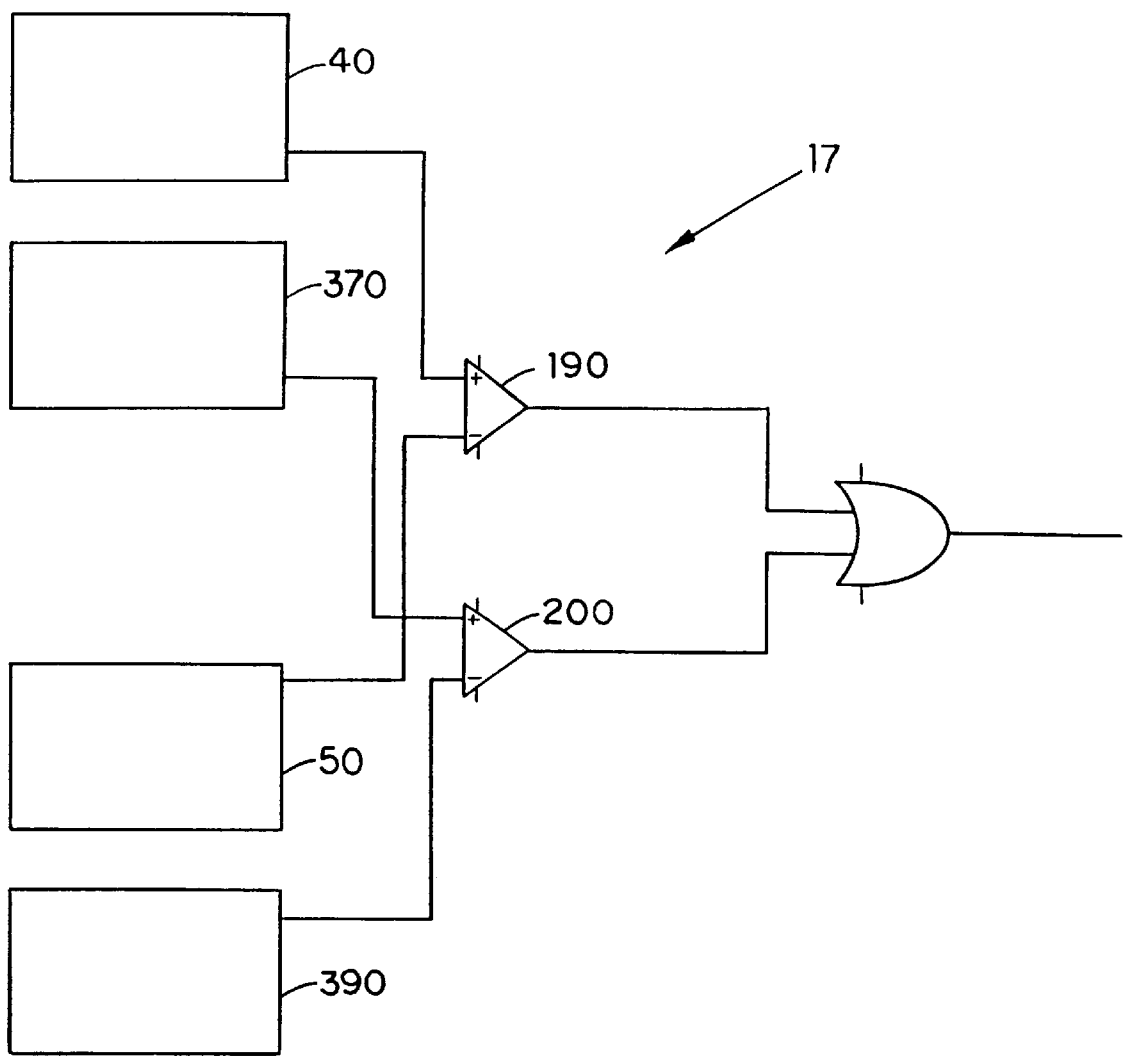
FIG. 8 is a schematic block diagram of the present invention for the case of non-open-collector comparators providing a normally-high logic output and having input-offset compensation.

Referring now to FIG. 6, and noticing the inventive embodiment illustrated in FIG. 2, the external circuit reference voltage connections must be reversed for the SEU immune comparator WOC having an NH-OC configuration, with first and second simple comparators 20 and 30 that utilize open-collector outputs. Similarly, as can be seen in FIG. 7, a SEU immune comparator WOC, having a NL-NOC configuration 16 may also be implemented using duplicate external reference voltage circuits. More particularly, the first and second plus and minus external circuits 40 and 50 are connected directly to the first NOC plus and minus inputs 210 and 220, respectively. The second plus and minus external circuits 370 and 390 are connected directly to the second NOC plus and minus inputs 230 and 240, respectively. The balance of the circuitry function and operation are identical to that illustrated in FIG. 3. Finally, as is shown in FIG. 8, a SEU immune comparator WOC, having a NH-NOC configuration, can be seen. This circuitry is also identical in function and configuration to that illustrated in FIG. 4, with the exception of the plus and minus duplicate external circuit connections, which are identical to those shown and discussed for FIG. 6.

Depending on the particular circuitry design requirements, the additional propagation delays introduced by some of the illustrated embodiments may or may not be tolerated. For minimal delay applications, the embodiments illustrated in FIGS. 1 and 5 should be used.

Various embodiments of the invention make use of different output stage circuitry, including an OC comparator output, a NOC comparator output, and AND, OR, and inverter gates. Thus, output current drive capability may change for each embodiment. If the designer needs more output drive than is available from a particular embodiment, as illustrated, additional non-inverting, SEU immune stages can be added to any of the embodiments. It is assumed good design practice will be used by the designer, and that those skilled in the art will be aware that drive requirements, and the means satisfy them, vary from one situation to another.

Those skilled in the art will realize that the approaches outlined above to providing a SEU immune comparator circuit, utilizing comparators having OC outputs, or comparators having NOC outputs, can be generalized to the case of providing a plurality of simple comparators for each case. That is, using the example of FIG. 1, a NL SEU immune comparator may comprise a plurality of simple comparators, each one having a plus input, a minus input, and an open collector output. Each of the plus inputs may be adapted to receive a plus output from a plus external circuit, and each of the minus inputs may also be adapted to receive a minus output from a minus external circuit. Each of the OC outputs is connected together at an OC output connection so as to provide a final NL output. While this results in an increased power and space requirement for the circuitry, the reliability of the circuitry is also increased.

The expansion concept may also be used in the case of NH-OC, NL-NOC and NH-NOC comparator configurations. That is, a plurality of simple comparators, each having a plus input, a minus input, and an OC output (or an NOC output) can be connected to provide an increased measure of reliability. For example, in the case of the NH-OC SEU immune comparator, each of the plus inputs is adapted to receive a minus output from a minus external circuit, and each of the minus inputs is adapted to receive a plus output from a plus external circuit. Each one of the open collector outputs is connected together at an open collector output connection, which is in turn connected to the inverter input so as to provide a final NH output connected to the inverter output. In the case of the NLNOC SEU immune comparator, each one of the plus inputs from the plurality of simple comparators is adapted to receive a plus output from a plus external circuit, and each one of the minus inputs is adapted to receive a minus output from a minus external circuit. However, in this case, each one of the comparator outputs is connected to a SEU immune AND gate having a plurality of AND inputs, wherein each one of the outputs is connected to a corresponding selected one of the AND inputs so as to provide a final NL output connected to the AND output. Finally, in the case of the NH-NOC comparator, each of the plus inputs from the plurality of simple comparators is adapted to receive a plus output from a selected plus external circuit, and each one of the minus inputs from the plurality of simple comparators is adapted to receive a selected minus output from a minus external circuit. However, in this case, each one of the comparator outputs is connected to a corresponding selected one of the OR inputs of an SEU immune OR gate having a plurality of OR inputs so as to provide a final NH output connected to the OR output.

The expansion concept may also include the construction of NL-OC, NHOC, NL-NOC, and NH-NOC SEU immune comparators having input offset compensation. In these cases, the circuitry is identical to that described for the expansion to a plurality of comparators as described above respecting connections from the individual simple comparator outputs onward through to the final output of the SEU immune comparator itself. However, the input voltage reference circuitry must now be duplicated to match the number of simple comparators. For example, in the case of the NL-OC SEU immune comparator, comprising a plurality simple comparators, each having a plus input, a minus input, and an OC output, each one of the plus inputs is adapted to receive a plus output from a plus external circuit selected from a plurality of plus external circuits. Each one of the minus inputs is also adapted to receive a minus output from a minus external circuit selected from a plurality of minus external circuits. The selected one of the plurality of plus external circuits and the selected one of the plurality of minus external circuits is constructed or adapted so as to trip the simple comparator to which they are connected at substantially the same time as the other simple comparators, (to which they are not connected) which are each individually connected to a different, selected plus external circuit and a different selected minus external circuit. That is, each simple comparator has a plus external circuit and minus external circuit dedicated to its own inputs, and not to those of any other simple comparator which comprise the SEU immune comparator. This prevents the creation of input offset voltages and/or currents which may arise when external circuits are connected to more than one comparator input simultaneously. Of course, the plurality of plus and minus external circuits can also be connected in an identical fashion to the plural expansion of simple comparators for each of the other cases, namely, the NH-OC, NL-NOC, and NH-NOC SEU immune comparators.

Although the invention has been described with reference to specific embodiments, this description is not meant to be construed in a limited sense. The various modifications of the disclosed embodiments, as well as alternative embodiments of the invention will become apparent to persons skilled in the art upon reference to the description of the invention. It is, therefore, contemplated that the appended claims will cover such modifications that fall within the scope of the invention, or their equivalents.

What is claimed is:

1. A normally low single event upset immune comparator comprising:
   a first simple comparator having a first open-collector plus input, a first open-collector minus input, and a first open-collector comparator output; and
   a second simple comparator having a second open-collector plus input, a second open-collector minus input, and a second open-collector comparator output, wherein the first and second open-collector plus inputs are adapted to receive a first plus output from a first plus external circuit, the first and second open-collector minus inputs are adapted to receive a first minus output from a first minus external circuit, and the first and second open-collector outputs are directly connected together at an open-collector output connection so as to provide a final normally-low output.

2. A normally high single event upset immune comparator comprising:
   a first simple comparator having a first open-collector plus input, a first open-collector minus input, and a first open-collector comparator output;
   a second simple comparator having a second open-collector plus input, a second open-collector minus input, and a second open-collector comparator output; and
   a single event upset immune inverter having an inverter input and an inverter output, wherein the first and second open-collector plus inputs are adapted to receive a first minus output from a first minus external circuit, the first and second open-collector minus inputs are adapted to receive a first plus output from a first plus external circuit, and the first and second open-collector outputs are directly connected together at an open-collector output connection, which is in turn connected to the inverter input so as to provide a final normally-high output connected to the inverter output.

3. A normally low single event upset immune comparator comprising:
   a first non-open-collector simple comparator having a first non-open-collector plus input, a first non-open-collector minus input, and a first non-open-collector comparator output; and
   a second non-open-collector simple comparator having a second non-open-collector plus input, a second non-open-collector minus input, and a second non-open-collector comparator output; and
   a single event upset immune AND gate having a first AND input, a second AND input, and an AND output, wherein the first and second non-open-collector plus inputs are adapted to receive a first plus output from a first plus external circuit, the first and second non-open-collector minus inputs are adapted to receive a first minus output from a first minus external circuit, the first non-open-collector output is connected to the first AND input, and the second non-open-collector output is connected to the second AND input so as to provide a final normally-low output connected to the AND output.

4. A normally high single event upset immune comparator comprising:

a first non-open-collector simple comparator having a first non-open-collector plus input, a first non-open-collector minus input, and a first non-open-collector comparator output; and a second non-open-collector simple comparator having a second non-open-collector plus input, a second non-open-collector minus input, and a second non-open-collector comparator output; and a single event upset immune OR gate having a first OR input, a second OR input, and an OR output, wherein the first and second non-open-collector plus inputs are adapted to receive a first plus output from a first plus external circuit, the first and second non-open-collector minus inputs are adapted to receive a first minus output from a first minus external circuit, the first non-open-collector output is connected to the first OR input, and the second non-open-collector output is connected to the second OR input so as to provide a final normally-high output connected to the OR output.

5. A normally low single event upset immune comparator having input offset compensation comprising:

a first simple comparator having a first open-collector plus input, a first open-collector minus input, and a first open-collector comparator output; and a second simple comparator having a second open-collector plus input, a second open-collector minus input, and a second open-collector comparator output, wherein the first open-collector plus input is adapted to receive a first plus output from a first plus external circuit, the second open-collector plus input is adapted to receive a second plus output from a second plus external circuit, the first open-collector minus input is adapted to receive a first minus output from a first minus external circuit, the second open-collector minus input is adapted to receive a second minus output from a second minus external circuit, the second plus and minus external circuits are adapted to trip the second simple comparator at the same voltage levels as the first plus and minus external circuits operate to trip the first simple comparator, and the first and second open-collector outputs are directly connected together at an open-collector output connection so as to provide a final normally-low output.

6. A normally high single event upset immune comparator having input offset compensation comprising:

a first simple comparator having a first open-collector plus input, a first open-collector minus input, and a first open-collector comparator output;

a second simple comparator having a second open-collector plus input, a second open-collector minus input, and a second open-collector comparator output; and a single event upset immune inverter having an inverter input and an inverter output, wherein the first open-collector plus input is adapted to receive a first minus output from a first minus external circuit, the second open-collector plus input is adapted to receive a second minus output from a second minus external circuit, the first open-collector minus input is adapted to receive a first plus output from a first plus external circuit, the second open-collector minus input is adapted to receive a second plus output from a second plus external circuit, the second plus and minus external circuits are adapted to trip the second simple comparator at the same voltage levels as the first plus and minus external circuits operate to trip the first simple comparator, and the first and second open-collector outputs are directly connected together at an open-collector output connection, which is in turn connected to the inverter input so as to provide a final normally-high output connected to the inverter output.

7. A normally low single event upset immune comparator having input offset compensation comprising:

a first non-open-collector simple comparator having a first non-open-collector plus input, a first non-open-collector minus input, and a first non-open-collector comparator output; and a second non-open-collector simple comparator having a second non-open-collector plus input, a second non-open-collector minus input, and a second non-open-collector comparator output; and a single event upset immune AND gate having a first AND input, a second AND input, and an AND output, wherein the first non-open-collector plus input is adapted to receive a first plus output from a first plus external circuit, the second non-open-collector plus input is adapted to receive a second plus output from a second plus external circuit, the first non-open-collector minus input is adapted to receive a first minus output from a first minus external circuit, the second non-open-collector minus input is adapted to receive a second minus output from a second minus external circuit, the first non-open-collector output is connected to the first AND input, the second plus and minus external circuits are adapted to trip the second simple comparator at the same voltage levels as the first plus and minus external circuits operate to trip the first simple comparator, and the second non-open-collector output is connected to the second AND input so as to provide a final normally-low output connected to the AND output.

8. A normally high single event upset immune comparator having input offset compensation comprising:

a first non-open-collector simple comparator having a first non-open-collector plus input, a first non-open-collector minus input, and a first non-open-collector comparator output; and a second non-open-collector simple comparator having a second non-open-collector plus input, a second non-open-collector minus input, and a second non-open-collector comparator output; and a single event upset immune OR gate having a first OR input, a second OR input, and an OR output, wherein the first non-open-collector plus input is adapted to receive a first plus output from a first plus external circuit, the second non-open-collector plus input is adapted to receive a second plus output from a second plus external circuit, the first non-open-collector minus input is adapted to receive a first minus output from a first minus external circuit, the second non-open-collector minus input is adapted to receive a second minus output from a second minus external circuit, the first non-open-collector output is connected to the first OR input, the second plus and minus external circuits are adapted to trip the second simple comparator at the same voltage levels as the first plus and minus external circuits operate to trip the first simple comparator, and the second non-open-collector output is connected to the second OR input so as to provide a final normally-high output connected to the OR output.

9. A normally low single event upset immune comparator comprising:

a plurality of simple comparators, each one of said simple comparators having a plus input, a minus input, and an open-collector output, wherein each one of the plus inputs is adapted to receive a plus output from a plus external circuit, each one of the minus inputs is adapted to receive a minus output from a minus external circuit, and each one of the open-collector outputs is directly connected together at an open-collector output connection so as to provide a final normally-low output.

10. A normally high single event upset immune comparator comprising:

a plurality of simple comparators, each one of said simple comparators having a plus input, a minus input, and an open-collector output; and a single event upset immune inverter having an inverter input and an inverter output, wherein each one of the plus inputs is adapted to receive a minus output from a minus external circuit, each one of the minus inputs is adapted to receive a plus output from a plus external circuit, and each one of the open-collector outputs is directly connected together at an open-collector output connection, which is in turn connected to the inverter input so as to provide a final normally-high output connected to the inverter output.

11. A normally low single event upset immune comparator comprising:

a plurality of simple comparators, each one of said simple comparators having a plus input, a minus input, and a comparator output; and a single event upset immune AND gate having a plurality of AND inputs and an AND output, wherein each one of the plus inputs is adapted to receive a plus output from a plus external circuit, each one of the minus inputs is adapted to receive a minus output from a minus external circuit, and each one of the comparator outputs is connected to a corresponding selected one of the AND inputs so as to provide a final normally-low output connected to the AND output.

12. A normally high single event upset immune comparator comprising:

a plurality of simple comparators, each one of said simple comparators having a plus input, a minus input, and a comparator output; and a single event upset immune OR gate having a plurality of OR inputs and an OR output, wherein each one of the plus inputs is adapted to receive a plus output from a plus external circuit, each one of the minus inputs is adapted to receive a minus output from a minus external circuit, and each one of the comparator outputs is connected to a corresponding selected one of the OR inputs so as to provide a final normally-high output connected to the OR output.

13. A normally low single event upset immune comparator having input offset compensation comprising:

a plurality of simple comparators, each one of said simple comparators having a plus input, a minus input, and an open-collector output, wherein each one of the plus inputs is adapted to receive a plus output from a plus external circuit selected from a plurality of plus external circuits, each one of the minus inputs is adapted to receive a minus output from a minus external circuit selected from a plurality of minus external circuits, the selected one of the plurality of plus external circuits and the selected one of the plurality of minus external circuits is adapted to trip a selected one of the simple comparators at the same voltage levels as a selected other one of the plurality of plus external circuits and a selected other one of the plurality of minus external circuits is adapted to trip a selected other one of the simple comparators, and each one of the open-collector outputs is directly connected together at an open-collector output connection so as to provide a final normally-low output.

14. A normally high single event upset immune comparator having input offset compensation comprising:

a plurality of simple comparators, each one of said simple comparators having a plus input, a minus input, and an open collector output; and a single event upset immune inverter having an inverter input and an inverter output, wherein in each one of the plus inputs is adapted to receive a minus output from a minus external circuit selected from a plurality of minus external circuits, and each one of the minus inputs is adapted to receive a plus output from a plus external circuit selected from a plurality of plus external circuits, the selected one of the plurality of minus external circuits and the selected one of the plurality of plus external circuits is adapted to trip a selected one of the simple comparators at the same voltage levels as a selected other one of the plurality of minus external circuits and a selected other one of the plurality of plus external circuits is adapted to trip a selected other one of the simple comparators, and each one of the open collector outputs is directly connected together at an open collector output connection, which is in turn connected to the inverter input so as to provide a final normally-high output connected to the inverter output.

15. A normally low single event upset immune comparator having input offset compensation comprising:

a plurality of simple comparators, each one of said simple comparators having a plus input, a minus input, and a comparator output; and a single event upset immune AND gate having a plurality of AND inputs and an AND output, wherein each one of the plus inputs is adapted to receive a plus output from a plus external circuit selected from a plurality of plus external circuits, each one of the minus inputs is adapted to receive a minus output from a minus external circuit selected from a plurality of minus external circuits, the selected one of the plurality of plus external circuits and the selected one of the plurality of minus external circuits is adapted to trip a selected one of the simple comparators at the same voltage levels as a selected other one of the plurality of plus external circuits and a selected other one of the plurality of minus external circuits is adapted to trip a selected other one of the simple comparators, and each one of the comparator outputs is connected to a corresponding selected one of the AND inputs, so as to provide a final normally-low output connected to the AND output.

16. A normally high single event upset immune comparator having input offset compensation comprising:

a plurality of simple comparators, each one of said simple comparators having a plus input, a minus input, and a comparator output; and a single event upset immune OR gate having a plurality of OR inputs and an OR output, wherein each one of the plus inputs is adapted to receive a plus output from a plus external circuit selected from a plurality of plus external circuits, each one of the minus inputs is adapted to receive a minus output from a minus external circuit selected from a plurality of plus external circuits and the selected one of the plurality of minus external circuits is adapted to trip a selected one of the simple comparators at the same voltage levels as a selected other one of the plurality of plus external circuits and a selected other one of the plurality of minus external circuits is adapted to trip a selected other one of the simple comparators, and each one of the comparator outputs is connected to a corresponding selected one of the OR inputs so as to provide a final normally-high output connected to the OR output.

* * * * *